United States Patent
Watanabe et al.

(10) Patent No.: US 7,645,677 B2
(45) Date of Patent: Jan. 12, 2010

(54) METHOD FOR MANUFACTURING SEMICONDUCTOR DEVICE

(75) Inventors: Tomoyuki Watanabe, Tokyo (JP); Atsushi Yoshinouchi, Tokyo (JP)

(73) Assignee: Ishikawajima-Harima Heavy Industries Co., Ltd., Tokyo (JP)

(*) Notice: Subject to any disclaimer, the term of this patent is extended or adjusted under 35 U.S.C. 154(b) by 364 days.

(21) Appl. No.: 10/598,961

(22) PCT Filed: May 28, 2004

(86) PCT No.: PCT/JP2004/007375

§ 371 (c)(1), (2), (4) Date: Sep. 15, 2006

(87) PCT Pub. No.: WO2005/088694

PCT Pub. Date: Sep. 22, 2005

(65) Prior Publication Data

US 2008/0160783 A1 Jul. 3, 2008

(30) Foreign Application Priority Data

Mar. 16, 2004 (JP) ............................ 2004-073675

(51) Int. Cl.
*H01L 21/76* (2006.01)
(52) U.S. Cl. ...................................... 438/424; 432/702
(58) Field of Classification Search ................ 438/424, 438/428, 430–438, 699–703
See application file for complete search history.

(56) References Cited

U.S. PATENT DOCUMENTS 4,571,819 A * 2/1986 Rogers et al. ............... 438/430
4,656,497 A * 4/1987 Rogers et al. ............... 257/397
4,666,556 A * 5/1987 Fulton et al. ................ 438/431

(Continued)

FOREIGN PATENT DOCUMENTS

JP          58-168259          10/1983

(Continued)

OTHER PUBLICATIONS

International Search Report issued in corresponding application No. PCT/JP2004/007375, completed Aug. 18, 2004 and mailed Sep. 7, 2004.

(Continued)

*Primary Examiner*—Savitri Mulpuri
(74) *Attorney, Agent, or Firm*—Griffin & Szipl, P.C.

(57) ABSTRACT

A method for manufacturing semiconductor device according to the present invention comprises a first film forming step of forming, on a concave and convex portion formed by an element on a semiconductor substrate, an oxidation preventive layer which prevents permeation of moisture into the element; a second film forming step of forming, on this oxidation preventive layer, an expansion layer which can be oxidized and expanded by a heat treatment in an oxidation atmosphere; a third film forming step of forming, on this expansion layer, an insulating film which can be fluidized by the heat treatment in the oxidation atmosphere; and an expansion step of subjecting, to the heat treatment in the oxidation atmosphere, the semiconductor substrate on which the oxidation preventive layer, the expansion layer and the insulating film have been formed, to fluidize the insulating film and to oxidize and expand the expansion layer, thereby eliminating bubbles generated in the insulating film.

3 Claims, 8 Drawing Sheets

U.S. PATENT DOCUMENTS

| | | | |
|---|---|---|---|
| 6,368,931 B1 * | 4/2002 | Kuhn et al. | 438/359 |
| 6,436,790 B2 * | 8/2002 | Ito | 438/424 |
| 6,461,937 B1 * | 10/2002 | Kim et al. | 438/431 |
| 6,573,154 B1 * | 6/2003 | Sridhar et al. | 438/430 |
| 6,881,646 B2 * | 4/2005 | Ishitsuka et al. | 438/424 |
| 6,890,833 B2 * | 5/2005 | Belyansky et al. | 438/426 |
| 6,955,974 B2 * | 10/2005 | Lee et al. | 438/437 |
| 7,052,970 B2 * | 5/2006 | Radecker | 438/435 |
| 7,122,416 B2 * | 10/2006 | Nevin et al. | 438/221 |
| 7,183,226 B2 * | 2/2007 | Lee et al. | 438/749 |
| 2003/0216006 A1 * | 11/2003 | Li et al. | 438/424 |
| 2003/0224580 A1 * | 12/2003 | Huang et al. | 438/435 |
| 2004/0018696 A1 * | 1/2004 | Wieczorek et al. | 438/431 |
| 2004/0248373 A1 * | 12/2004 | Park | 438/424 |
| 2005/0037613 A1 * | 2/2005 | Grunow et al. | 438/643 |
| 2005/0221557 A1 * | 10/2005 | Wang et al. | 438/243 |
| 2007/0087567 A1 * | 4/2007 | Lee et al. | 438/687 |

FOREIGN PATENT DOCUMENTS

| | | |
|---|---|---|
| JP | 62-252950 | 11/1987 |
| JP | 05-067607 | 3/1993 |
| JP | 10-275805 | 10/1998 |
| JP | 2000-306992 | 11/2000 |
| JP | 2004-047624 | 2/2004 |
| KR | 10-2000-0041590 | 7/2000 |
| KR | 10-2004-0005590 | 1/2004 |
| KR | 10-2005-0003010 | 1/2005 |

OTHER PUBLICATIONS

Korean Office Action issued in corresponding Korean Patent Application No. 10-2006-7018819, dated Jan. 23, 2009 (English translation not available).

* cited by examiner

METHOD FOR MANUFACTURING SEMICONDUCTOR DEVICE

This is a National Phase Application in the United States of International Patent Application No. PCT/JP2004/007375 filed May 28, 2004, which claims priority on Japanese Patent Application No. 073675/2004, filed Mar. 16, 2004. The entire disclosures of the above patent applications are hereby incorporated by reference.

BACKGROUND OF THE INVENTION

1. Technical Field of the Invention

The present invention relates to a method for manufacturing a semiconductor device including an insulating film on a semiconductor substrate (wafer). More particularly, it relates to a method for manufacturing semiconductor device which can completely eliminate voids (bubbles) generated in the insulating film or open pores generated owing to insufficient filling-in of the insulating film.

2. Description of the Related Art

For example, in steps of manufacturing a semiconductor device, an MOSFET gate electrode is formed on a semiconductor substrate to protrude therefrom, whereby a concave portion is formed between the gate electrode and a gate electrode adjacent to the electrode, and a concave portion, a convex portion and a stepped portion (trench) are made in the gate electrode and between the gate electrodes. When this stepped portion enlarges, there occurs focus deviation during drawing of a wiring pattern by exposure. In a case where wiring lines are formed to intersect with one another, a lap portion of an intersecting portion becomes thin, and this causes disconnection. Such problems are generated which result in defects of the semiconductor device. To solve the problems, as a method of eliminating such stepped portion, an inter layer dielectric such as a BPSG film or a PSG film is formed on the stepped portion by a chemical vapor deposition (CVD), and the surface of this inter layer dielectric is flattened by a certain method.

Figure 1A:
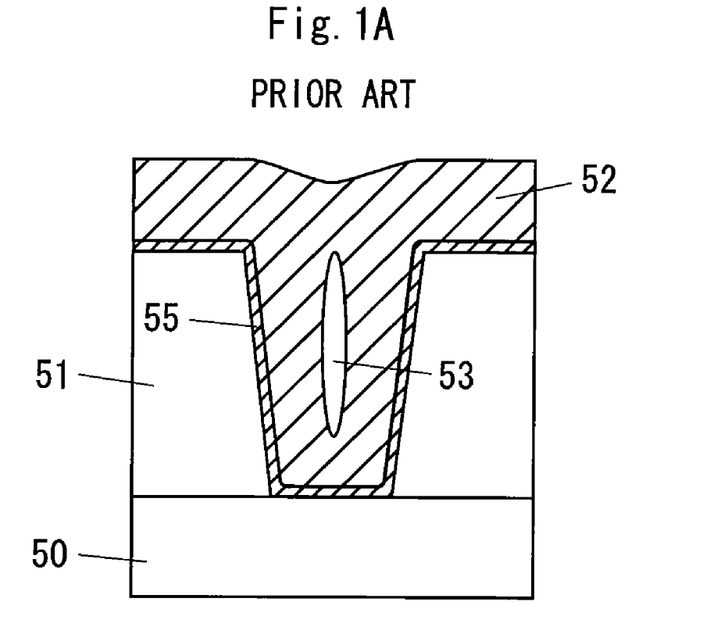
FIGS. 1A and 1B are diagrams showing prior arts.
Figure 1B:
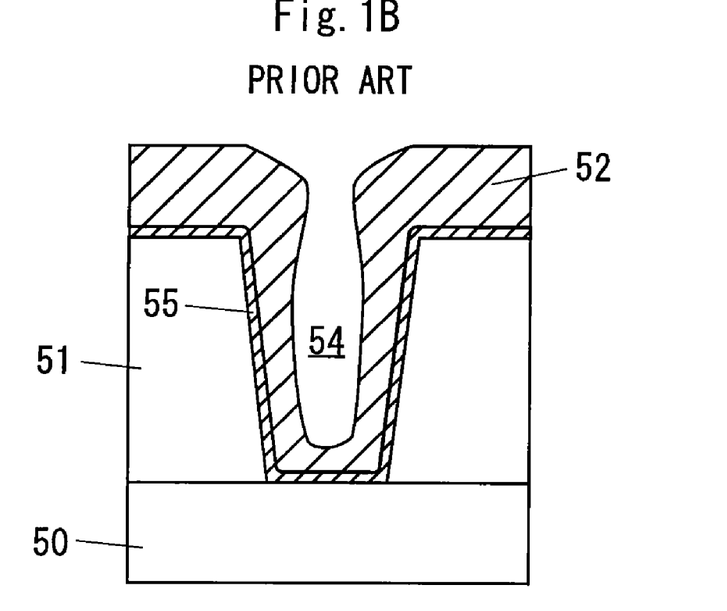

In recent years, as there have progressed the miniaturization and high densification of semiconductor devices with high integration and capacity enlargement thereof, an aspect ratio (ratio of a depth-direction dimension with respect to a lateral dimension of a structure) of each structure rises, and the stepped portion of the structure tends to enlarge in a preparing step. Therefore, there rises a probability that voids (bubbles) are generated in the insulating film during formation of the above inter layer dielectric, and open pores are sometimes generated in the insulating film owing to unevenness of the formation of the insulating film in the trench or lack of a film formation amount (film formation defect). FIGS. 1A and 1B show sectional shapes of a semiconductor device in the process of the manufacturing of a conventional semiconductor device, FIG. 1A shows a case where a void 53 is generated in an inter layer dielectric 52 formed on a concave and convex portion 51 formed by an element on a semiconductor substrate 50, and FIG. 1B shows a case where an open pore 54 is generated in the inter layer dielectric 52. It is to be noted that in FIGS. 1A and 1B, reference numeral 55 denotes a barrier layer.

Heretofore, the semiconductor substrate on which the inter layer dielectric has been formed is subjected to a heat treatment at a temperature of 900° C. in an inert gas atmosphere under a normal pressure (0.1 MPa) or subjected to a heat treatment at a temperature slightly below 900° C. in the atmosphere containing oxygen or water vapor under the normal pressure, thereby fluidizing (reflowing) the insulating film to thereby flatten the film. By this reflow treatment, the voids or the open pores generated in the insulating film have been eliminated. As prior arts associated with this method, the following patent documents 1 and 2 are disclosed.

The "method for flattening insulating film of semiconductor device" of Patent Document 1 has a purpose of effectively conducting a reflow treatment on a BPSG film of a semiconductor device at comparatively low temperature in a short period of time. In a method in which the insulating film formed on the concave and convex surface of a substrate of the semiconductor device is flattened by thermal reflow, the thermal reflow is performed in the atmosphere containing oxygen or water vapor under a pressure of 0.3 MPa or more. Moreover, according to this method, the quantity of oxygen to be diffused on the insulating film and the diffusion speed increase, and excellent reflow of the BPSG film is accomplished at a low temperature for a short period of time as compared with a conventional method.

The "method for manufacturing semiconductor device" of Patent Document 2 has a purpose of obtaining flatness which is sufficient for performing a low-temperature treatment. After an element is formed on a semiconductor substrate, a silicon nitride film is formed on this element. On this film, a BPSG film containing boron and phosphorus is formed, and further on this film, an SOG film containing at least one of boron and phosphorous is formed by a coating method. Then, the substrate is heat-treated in a high-pressure atmosphere containing water vapor. Therefore, the SOG film is gelatinized and flattened by a high external pressure which is applied to the film itself.

[Patent Document 1]
  Japanese Unexamined Patent Publication No. 5-67607

[Patent Document 2]
  Japanese Unexamined Patent Publication No. 10-275805

In the above "method for flattening insulating film of semiconductor device" of Patent Document 1, the heat treatment can be performed at 800° C. which is lower than a conventional reflow treatment temperature. In the "method for manufacturing semiconductor device" of Patent Document 2, the reflow treatment temperature can be set to 700° C. or less. It can be expected that the insulating film can be fluidized by the reflow treatment to eliminate the voids or the open pores generated in the insulating film. However, since the heat treatment temperature of 700° C. to 800° C. as in Patent Documents 1 and 2 adversely affects characteristics of the element to be miniaturized, there is a demand for a further decrease of the treatment temperature to reduce damages due to the heat treatment in further integrating the semiconductor device. Even in the treatment at the high temperature, in which a high fluidity is obtained, the voids remain sometimes without being completely eliminated, depending on a position where the voids have been generated or a size of the voids. The remaining voids might cause a device defect. Especially as the size of the voids is decreased, an effect produced by buoyancy during the fluidization deteriorates, and this increasingly raises a possibility that the voids remain. In a case where the open pores are generated in the insulating film, the surface of the open pores is flattened by surface tension of the insulating film during the reflow treatment, but the open pores are not closed, or the concave and convex portion (trenches) is not filled in.

SUMMARY OF THE INVENTION

The present invention has been developed in order to solve the above problems. That is, an object of the present invention is to provide a method for manufacturing a semiconductor device, in which voids in an inter layer dielectric can completely be eliminated at a heat treatment temperature that is lower than before, and further open pores generated in the inter layer dielectric can be filled in.

To achieve the object of the present invention, according to a first aspect of the invention, there is provided a method for manufacturing semiconductor device, including: a first film forming step of forming, on a concave and convex portion formed by an element on a semiconductor substrate, an oxidation preventive layer which prevents permeation of moisture into the element; a second film forming step of forming, on this oxidation preventive layer, an expansion layer which can be oxidized and expanded by a heat treatment in an oxidation atmosphere; a third film forming step of forming, on this expansion layer, an insulating film which can be fluidized by the heat treatment in the oxidation atmosphere; and an expansion step of subjecting, to the heat treatment in the oxidation atmosphere, the semiconductor substrate on which the oxidation preventive layer, the expansion layer and the insulating film have been formed, to fluidize the insulating film and to oxidize and expand the expansion layer, thereby eliminating bubbles generated in the insulating film.

In a second aspect of the invention, which is a preferable embodiment of the first aspect of the invention, the expansion layer is made of a polycrystalline silicon, an amorphous silicon or a silicide.

In a third aspect of the invention, which is a preferable embodiment of the first aspect of the invention, the expansion layer is made of aluminum, tantalum or an alloy of them.

In a fourth aspect of the invention, which is a preferable embodiment of the first aspect of the invention, the insulating film is a silicon oxide film containing at least one of phosphorus, arsenic, boron, fluorine and a halide.

In a fifth aspect of the invention, which is a preferable embodiment of the first aspect of the invention, the oxidation preventive layer is formed of a silicon nitride film.

In a sixth aspect of the invention, which is a preferable embodiment of the first aspect of the invention, a pressure of the oxidation atmosphere in the expansion step is atmospheric pressure or more, and a heat treatment temperature is 400° C. to 800° C.

According to a seventh aspect of the invention, there is provided a method for manufacturing semiconductor device, comprising a first film forming step of forming, on a concave and convex portion formed by an element on a semiconductor substrate, an oxidation preventive layer which prevents permeation of moisture into the element; a second film forming step of forming, on this oxidation preventive layer, an expansion flow layer which can be oxidized, expanded and fluidized by a heat treatment in an oxidation atmosphere and which has an insulating property; and an expansion step of subjecting, to the heat treatment in the oxidation atmosphere, the semiconductor substrate on which the oxidation preventive layer and the expansion flow layer have been formed, to oxidize, expand and fluidize the expansion flow layer, thereby eliminating bubbles or open pores generated in the expansion flow layer.

In an eighth aspect of the invention, which is a preferable embodiment of the seventh aspect of the invention, the expansion flow layer is made of a polycrystalline silicon or an amorphous silicon containing at least one of boron, phosphorus and fluorine.

In a ninth aspect of the invention, which is a preferable embodiment of the seventh aspect of the invention, the oxidation preventive layer is formed of a silicon nitride film.

In a tenth aspect of the invention, which is a preferable embodiment of the seventh aspect of the invention, a pressure of the oxidation atmosphere in the expansion step is atmospheric pressure or more, and a heat treatment temperature is 400° C. to 800° C.

According to the first to sixth aspects of the invention, the oxidation preventive layer is formed on the concave and convex portion formed by the element on the semiconductor substrate, the expansion layer is formed on the oxidation preventive layer, the insulating film is formed on the expansion layer, and the semiconductor substrate on which they have been formed is subjected to the heat treatment in the high-pressure oxidation atmosphere. The insulating film is fluidized, and the expansion layer is oxidized and expanded, thereby promoting the fluidization of the insulating film. In consequence, the voids (bubbles) generated in the insulating film can completely be eliminated.

Moreover, according to the seventh to tenth aspects of the invention, the oxidation preventive layer is formed on the concave and convex portion formed by the element on the semiconductor substrate, the expansion flow layer is formed on the oxidation preventive layer, and the semiconductor device on which they have been formed is subjected to the heat treatment in the high-pressure oxidation atmosphere, and the expansion flow layer is expanded and fluidized, whereby the voids (bubbles) generated in the expansion flow layer can completely be eliminated. Even in a case where the open pores are generated owing to insufficient filling-in of the expansion flow layer, the open pores are filled in owing to effects of the expansion and fluidization, and the open pores can therefore be eliminated.

In the conventional reflow treatment in which a fluidizing effect only is expected, a fluid resistance increases, when the voids become small. Therefore, it has been necessary to raise a treatment temperature or lengthen a treatment time. However, in a case where the expansion layer is used for promoting the fluidization of the insulating film as in the first to tenth aspects of the invention, the heat treatment temperature and time depend on expansion of the expansion layer. Therefore, as the voids become small, the expansion of the expansion layer for eliminating the voids may be small. Therefore, it is possible to lower the treatment temperature, or shorten the treatment time. Even in a case where the expansion flow layer is expanded and fluidized, the heat treatment temperature and time depend on the expansion of the expansion flow layer. Therefore, similarly it is possible to lower the treatment temperature, or shorten the treatment time.

Therefore, according to the method of manufacturing the semiconductor device of the present invention, it is possible to obtain effects that the treatment temperature can be set to be lower than before, the semiconductor device can be manufactured without any voids or open pores in the insulating film, and yield of the device can be enhanced.

Other objects and advantageous characteristics of the present invention will be apparent from the following description with reference to the accompanying drawings.

DESCRIPTION OF THE PREFERRED EMBODIMENT

Embodiments of the present invention will be described hereinafter in detail with reference to the accompanying drawings. It is to be noted that in each drawing, the same part is denoted with the same reference numeral, and redundant description is omitted.

First, there will be described the method for manufacturing semiconductor device in a first embodiment of the present invention. The method for manufacturing semiconductor device in the first embodiment of the present invention includes: a first film forming step of forming an oxidation preventive layer on a concave and convex portion formed by an element on a semiconductor substrate; a second film forming step of forming an expansion layer; a third film forming step of forming an insulating film; and an expansion step of subjecting, to a heat treatment, the semiconductor substrate on which they have been formed, thereby expanding the expansion layer. The respective steps will be described hereinafter.

Figure 2A:
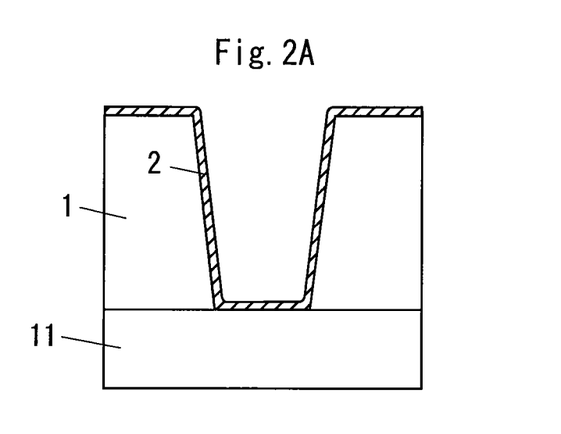
FIGS. 2A to 2C are diagrams showing sectional shapes of a semiconductor device to which there is applied the method for manufacturing semiconductor device in a first embodiment of the present invention.
Figure 2B:
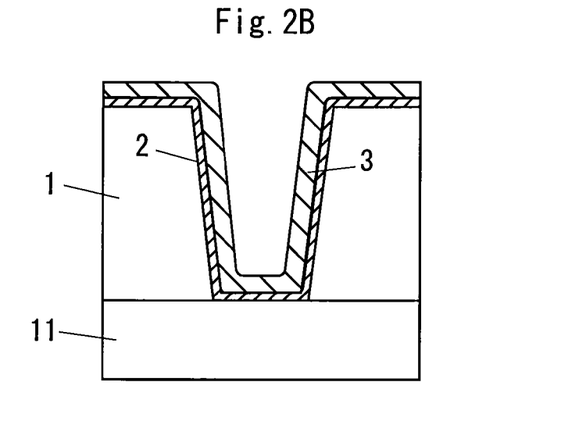
Figure 2C:
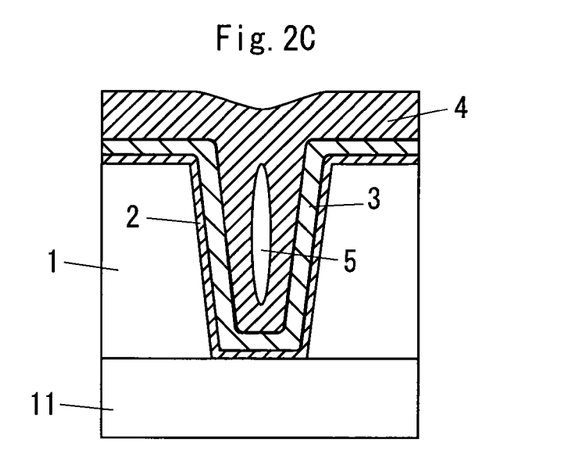

FIGS. 2A to 2C show sectional shapes of the semiconductor device to which there is applied the method for manufacturing semiconductor device in the first embodiment of the present invention. First, as shown in FIG. 2A, the first film forming step is performed to form an oxidation preventive layer 2 as a first layer by a low-pressure chemical vapor deposition (hereinafter referred to as "LPCVD") on a concave and convex portion 1 (trench) formed by a wiring structure (element) such as a gate insulating film or a gate electrode formed on a semiconductor substrate 11. In the present embodiment, a magnitude of the trench of the concave and convex portion 1 indicates a width of 1 μm and a depth of 2.5 μm, and the oxidation preventive layer 2 having a thickness of 150 nm was formed on this portion. This oxidation preventive layer 2 is formed of, for example, a silicon nitride film, and functions as a protective film (barrier layer) for preventing permeation of moisture due to a treatment of the subsequent step into the element.

Next, as shown in FIG. 2B, the second film forming step is performed by LPCVD to form, on the oxidation preventive layer 2 as the first layer, an expansion layer 3 as a second layer which can be oxidized and expanded by a heat treatment in an oxidation atmosphere. The expansion layer 3 is formed so that a thickness of the layer becomes ½ or more of a width of each void which would finally be generated in an insulating film 4 described later. In the present embodiment, the expansion layer 3 having a thickness of 100 nm was formed. This expansion layer 3 is preferably a film made of a polycrystalline silicon, an amorphous silicon or a silicide. The layer may be a film made of aluminum, tantalum or an alloy of them. Furthermore, in addition to the above expansion layer, it is possible to adopt all substances that have a property of being oxidized to expand in the oxidation atmosphere.

Next, as shown in FIG. 2C, the third film forming step is performed by an atmospheric-pressure chemical vapor deposition (hereinafter referred to as "APCVD") to form, on the expansion layer 3 as the second layer, the insulating film 4 as a third layer to such a degree as to fill in the concave and convex portion. This insulating film 4 is preferably a silicon oxide film (a BPSG film, a PSG film or the like) containing at least one of phosphorus, arsenic, boron, fluorine and a halide. At this time, a void 5 (bubble) is generated in the insulating film 4 as shown in the drawing.

Next, the expansion step is performed to subject the semiconductor substrate 11 having the formed first to third layers to a heat treatment in an atmosphere (oxidation atmosphere) containing oxygen or water vapor, whereby the expansion layer 3 is oxidized and expanded.

Figure 3:
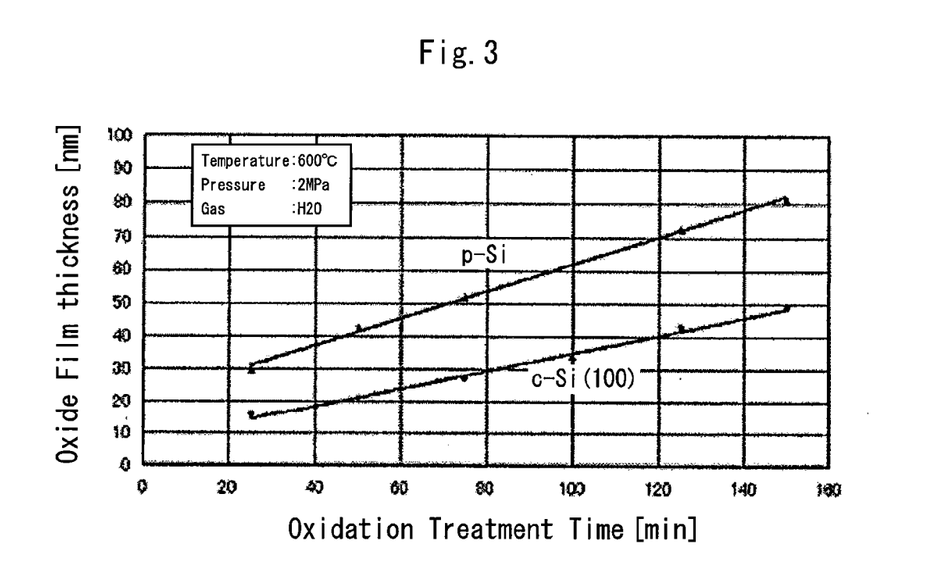
FIG. 3 is a diagram showing dependence of oxide film thicknesses of a polycrystalline silicon and single crystal silicon on a treatment time.

Here, FIG. 3 shows dependence of oxide film thicknesses of a polycrystalline silicon and single crystal silicon on a oxidation treatment time. The abscissa indicates an oxidation treatment time [min], and the ordinate indicates an oxide film thickness [nm]. In the figure, "p-Si" indicates the polycrystalline silicon, and "c-Si (100)" indicates the single crystal silicon (100). A heat treatment was performed in the atmosphere containing water vapor under conditions that a temperature and a pressure were 600° C. and 2 MPa, respectively. From this result, it is seen that the thicknesses of oxide films of both of the polycrystalline silicon and the single crystal silicon tend to increase in proportion to an oxidation treatment time.

Figure 4:
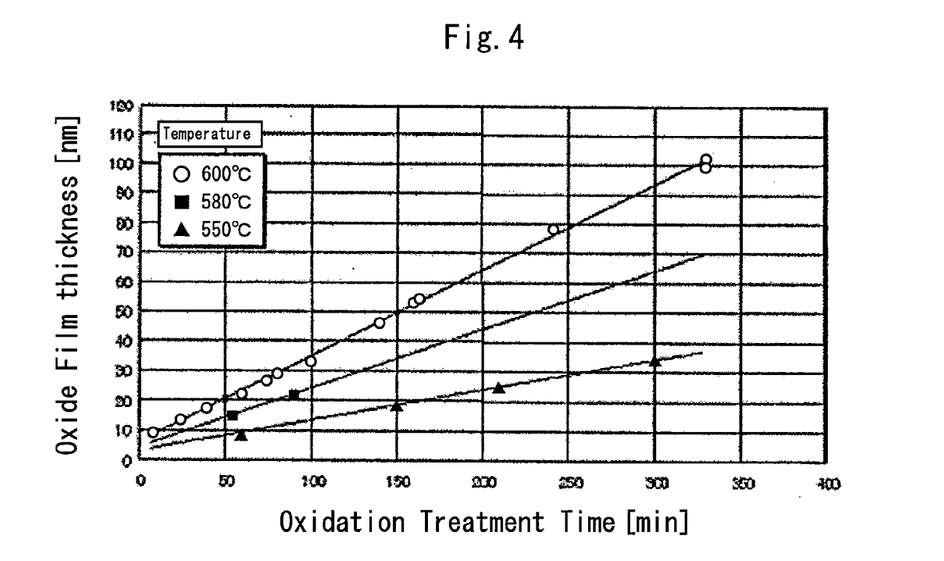
FIG. 4 is a diagram showing the dependence of the thickness of the single crystal silicon oxide film on a treatment temperature.

FIG. 4 shows dependence of the thickness of the single crystal silicon oxide film on an oxidation treatment temperature, the abscissa indicates an oxidation treatment time [min], and the ordinate indicates the oxide film thickness [nm]. In the figure, "white circle", "black square" and "black triangle" indicate treatment temperatures, respectively, "white circle" indicates 600° C., "black square" indicates 580° C., and "black triangle" indicates 550° C. Any of heat treatments was performed in the atmosphere containing water vapor under pressure conditions of 2 MPa. From this result, it is seen that the thickness of the oxide film of single crystal silicon tends to exponentially increase with respect to the oxidation treatment temperature.

Figure 5:
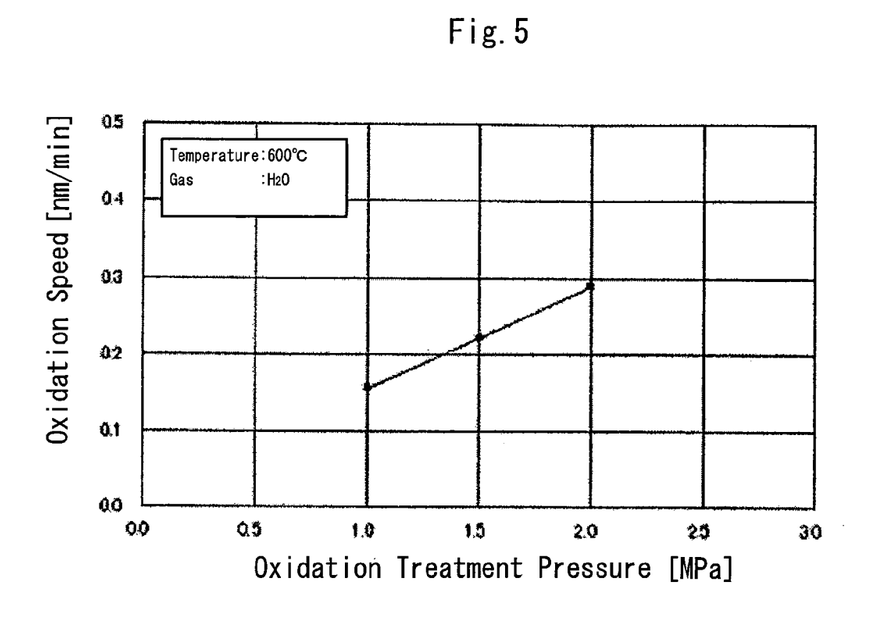
FIG. 5 is a diagram showing the dependence of the speed of the single crystal silicon oxide film on a treatment pressure.

FIG. 5 shows the dependence of the oxidation speed of the single crystal silicon oxide film on an oxidation pressure, the abscissa indicates an oxidation treatment pressure [MPa], and the ordinate indicates the oxidation speed [nm/min]. The heat treatment was performed in the atmosphere containing water vapor under heating conditions at 600° C. From this result, it is seen that the thickness of the oxide film of single crystal silicon tends to increase in proportion to the oxidation treatment pressure.

As one example of the heat treatment, the heat treatment was performed in the atmosphere containing water vapor under pressure conditions of 2 MPa and heating conditions at 600° C. In a case where an oxidation rate of the polycrystalline silicon was about 46 nm per hour, an oxidation rate of the amorphous silicon was about 24 nm per hour. When a void diameter was about 50 nm, and the expansion layer was a polycrystalline silicon layer, about two hours were required. When a void diameter was about 50 nm, and the expansion layer was an amorphous silicon layer, about four hours were required.

Figure 6A:
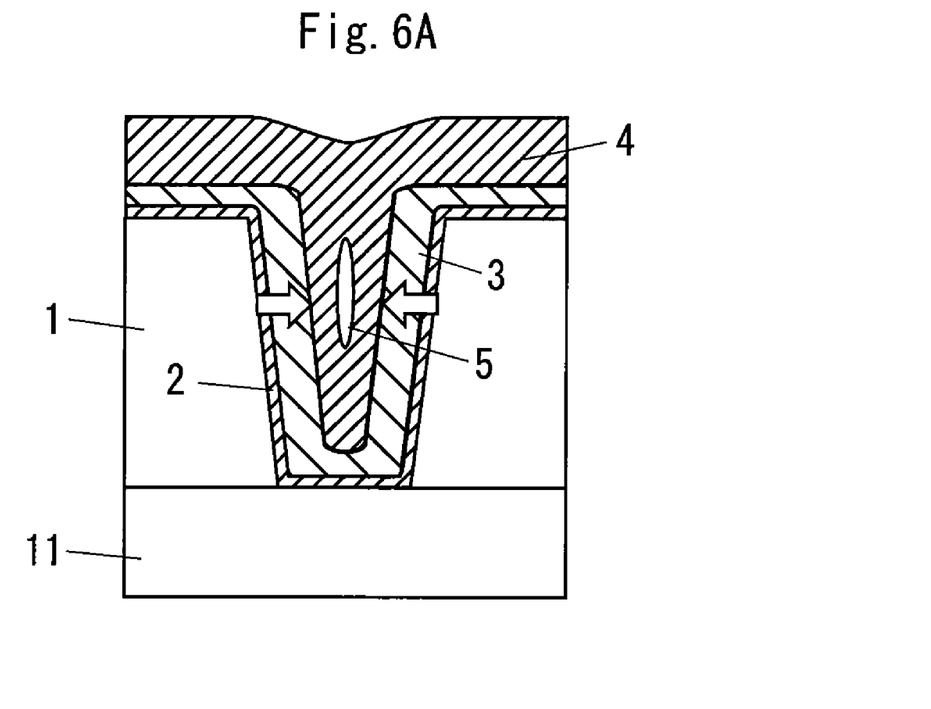
FIGS. 6A and 6B are diagrams showing a behavior in which voids in an insulating film are eliminated by the method for manufacturing semiconductor device in the first embodiment of the present invention.
Figure 6B:
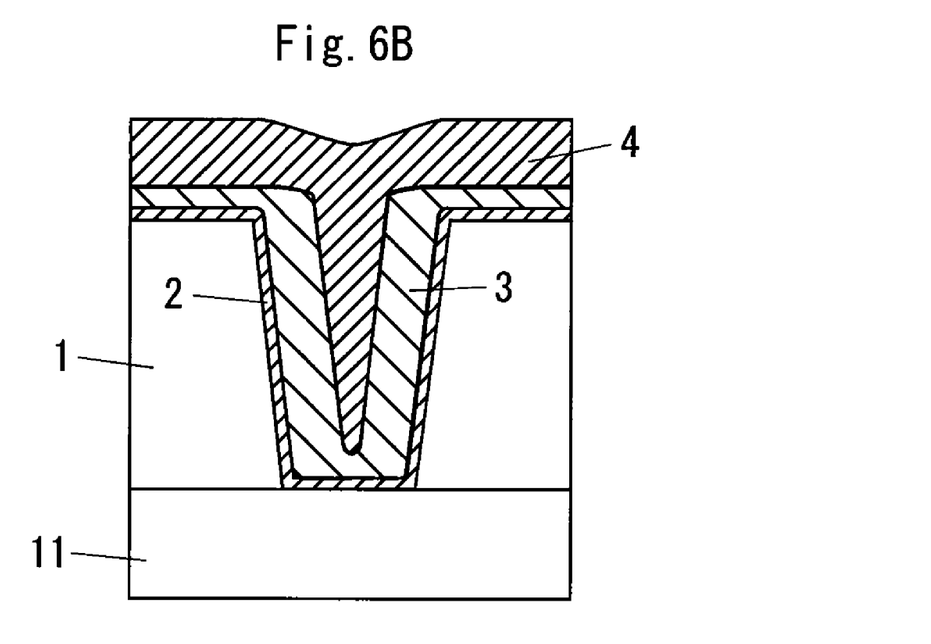

Therefore, based on these results, it is preferable that in the expansion step, the heat treatment is performed in the oxidation atmosphere under pressure conditions of atmospheric pressure (about 0.1 MPa) or more and under heating conditions at 400° C. to 800° C. From the result of FIG. 5, since the oxidation speed of the expansion layer 3 is proportional to the treatment pressure, a specific treatment pressure is set to a pressure which is not below a practical treatment time from a viewpoint of productivity or the like. This heat treatment is performed to oxidize the expansion layer 3 formed as the second layer in a high-pressure oxidation atmosphere. When the expansion layer 3 is a polycrystalline silicon layer, the layer changes to silicon oxide, and the oxidized polycrystalline silicon layer expands until the thickness is approximately doubled. At this time, the expansion layer 3 expands to thereby compress an insulating film 4 such as the BPSG film that is the third layer heated to lower viscosity and fluidized, and the void 5 in the insulating film 4 contracts as shown in FIG. 6A. Moreover, in a final stage of the heat treatment, the expansion layer 3 expands, whereby the void completely disappears as shown in FIG. 6B.

Moreover, in this stage, impurities from an insulating film 4 such as the BPSG film containing the impurities diffuse to the oxidized and expanded expansion layer 3, finally form a layer similar to the insulating film 4, and function as a void-free inter layer dielectric. For example, when the expansion layer 3 is the polycrystalline silicon, and the insulating film 4 is a BPSG film, the polycrystalline silicon is oxidized to form silicon oxide, and onto this film, the impurities from the BPSG film diffuse to finally form the BPSG film.

As described above, according to the first embodiment of the present invention, the oxidation preventive layer 2 is formed on the concave and convex portion 1 formed by the element on the semiconductor substrate 11, on the layer, the expansion layer 3 is formed, and on the layer, the insulating film 4 is formed. Moreover, the semiconductor substrate 11 on which they have been formed is subjected to the heat treatment in the high-pressure oxidation atmosphere to fluidize the insulating film 4 and to oxidize and expand the expansion layer 3. In consequence, since the fluidization of the insulating film 4 is promoted, it is possible to obtain an effect that the void 5 (bubble) generated in the insulating film 4 can completely be eliminated. As a result, yield of the device can be enhanced.

In the conventional reflow treatment in which a fluidizing effect only is expected, as the void becomes small, a fluid resistance increases. Therefore, it is necessary to raise the treatment temperature or lengthen the treatment time. However, in a case where the expansion layer 3 is used for promoting the fluidization of the insulating film 4 as in the present invention, the temperature and time of the heat treatment depend on expansion of the expansion layer 3. Therefore, as the void 5 becomes small, the expansion of the expansion layer 3 for eliminating the void 5 may be reduced. In consequence, it is possible to lower the treatment temperature or shorten the treatment time.

Next, there will be described the method for manufacturing semiconductor device in a second embodiment of the present invention. The method for manufacturing semiconductor device in the second embodiment of the present invention includes: a first film forming step of forming an oxidation preventive layer on a concave and convex portion 1 formed by an element on a semiconductor substrate 11; a second film forming step of forming an expansion flow layer; and an expansion step of subjecting the semiconductor substrate 11 having these formed films to a heat treatment, thereby expanding the expansion flow layer. The respective steps will be described hereinafter.

Figure 7A:
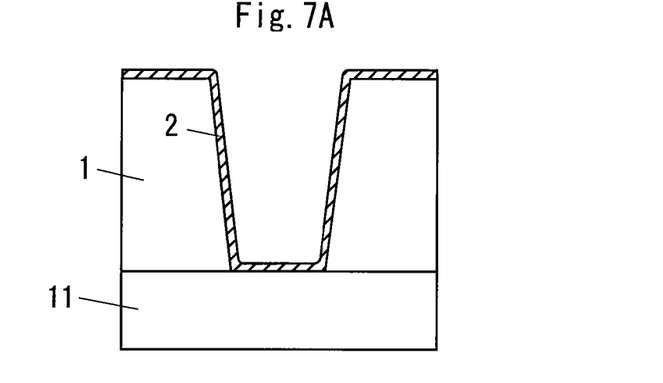
FIGS. 7A to 7E are diagrams showing sectional shapes of a semiconductor device to which there is applied the method for manufacturing semiconductor device in a second embodiment of the present invention.

FIGS. 7A to 7E show sectional shapes of the semiconductor device to which there is applied the method of manufacturing the semiconductor device in the second embodiment of the present invention. First, as shown in FIG. 7A, the first film forming step is performed to form an oxidation preventive layer 2 as a first layer by an LPCVD on the concave and convex portion 1 formed by the element on the semiconductor substrate 11. This oxidation preventive layer 2 is similar to that of the first embodiment.

Figure 7B:
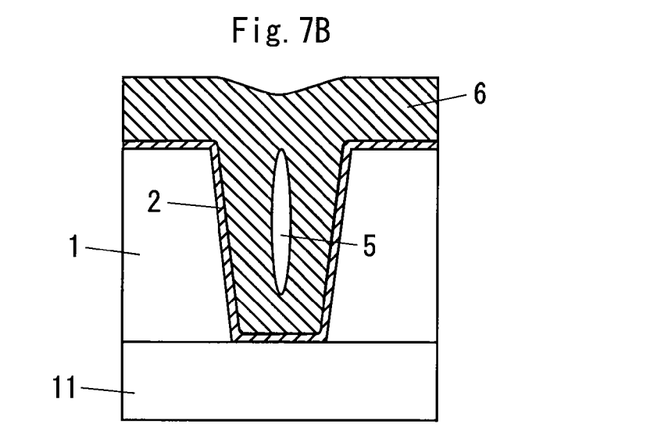
Figure 7C:
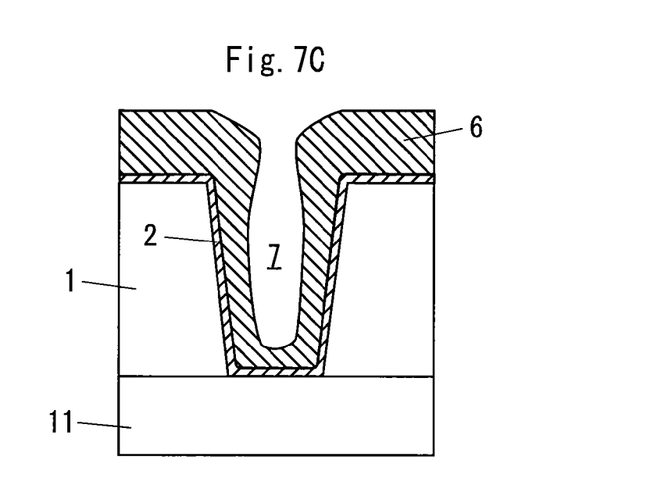

Next, as shown in FIG. 7B, the second film forming step is performed by the LPCVD to such a degree as to fill in the concave and convex portion 1, thereby forming, on the oxidation preventive layer 2 as the first layer, an expansion flow layer 6 as a second layer which can be oxidized, expanded and fluidized by a heat treatment in an oxidation atmosphere and which has an insulating property. At this time, when a void 5 (bubble) is generated in the expansion flow layer 6 as shown in the figure, or when the concave and convex portion 1 is insufficiently filled with the expansion flow layer 6 as shown in FIG. 7C, an open pore 7 is generated. This expansion flow layer 6 is preferably made of the polycrystalline silicon (doped polycrystalline silicon) containing at least one of boron, phosphorus and fluorine or an amorphous silicon (doped amorphous silicon). As the expansion flow layer 6, in addition to the above layer, it is possible to adopt all substances that are oxidized, expanded and fluidized in the oxidation atmosphere and that are oxidized to have an insulating property.

Next, the expansion step is performed to subject the semiconductor substrate 11 having the formed first and second layers thereon to a heat treatment in an oxidation atmosphere, thereby expanding and fluidizing the expansion flow layer. In the expansion step, in the same manner as in the first embodiment, it is preferable that the heat treatment is performed in the oxidation atmosphere under pressure conditions of atmospheric pressure (about 0.1 MPa) or more and under heating conditions at 400° C. to 800° C. This heat treatment is performed to oxidize the expansion flow layer 6 formed as the second layer in a high-pressure oxidation atmosphere. When the expansion flow layer 6 is a doped polycrystalline silicon or a doped amorphous silicon, the layer changes to silicon oxide (BSG, PSG, BPSG or the like) containing phosphorus, boron or the like. In this oxidation process, the expansion flow layer 6 expands. Moreover, the heat treatment is performed to thereby lower viscosity of the layer and fluidize the layer. At this time, the expansion flow layer 6 expands until the thickness is approximately doubled at maximum.

Figure 7D:
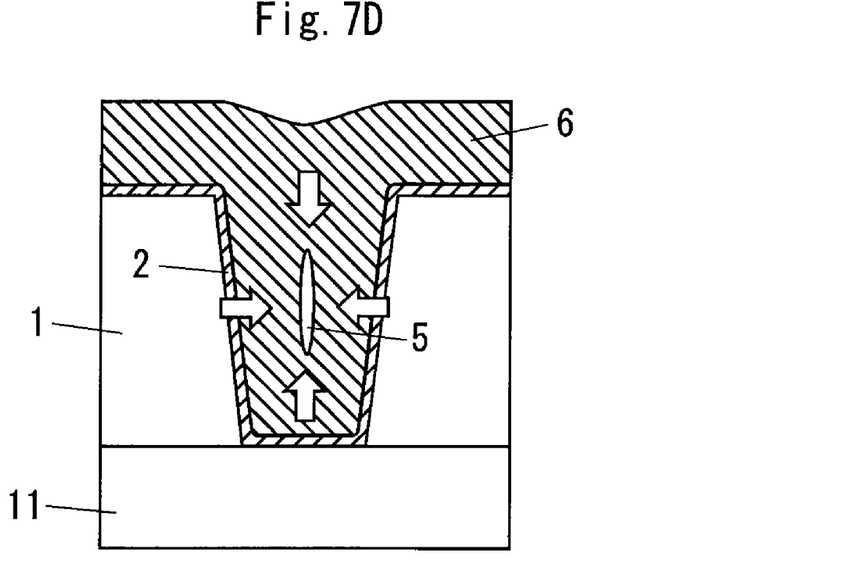
Figure 7E:
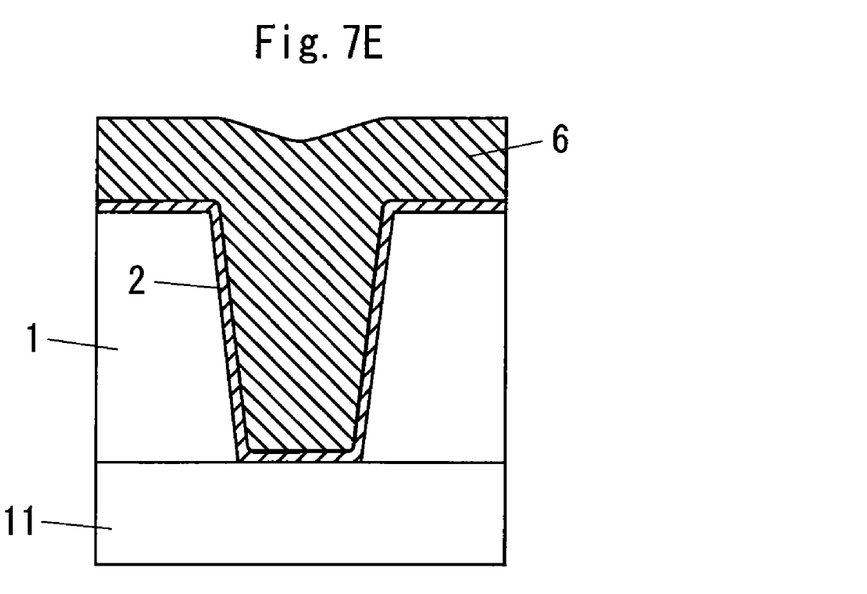
Figure 8A:
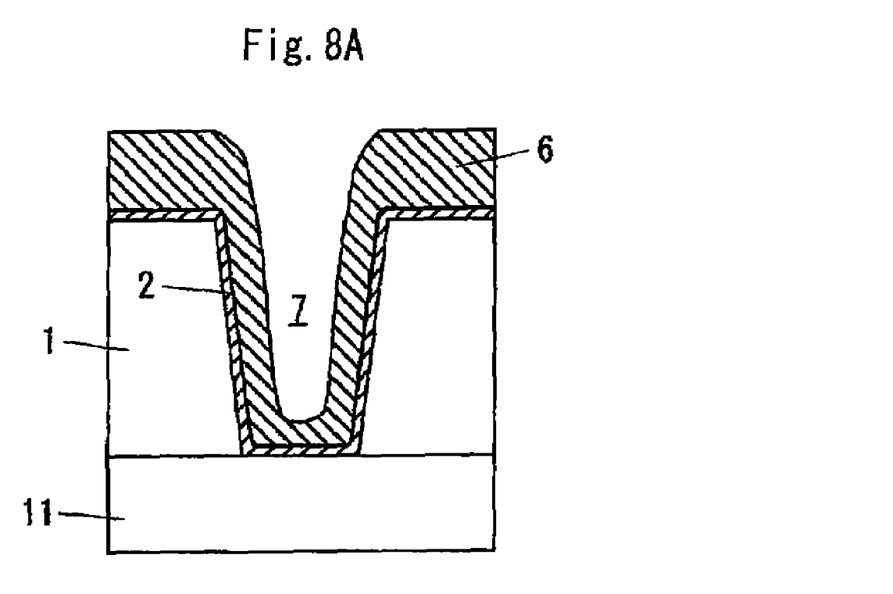
FIGS. 8A and 8B are diagrams showing a behavior in which open pores of an expansion flow layer are eliminated by the method for manufacturing semiconductor device in the second embodiment of the present invention.
Figure 8B:
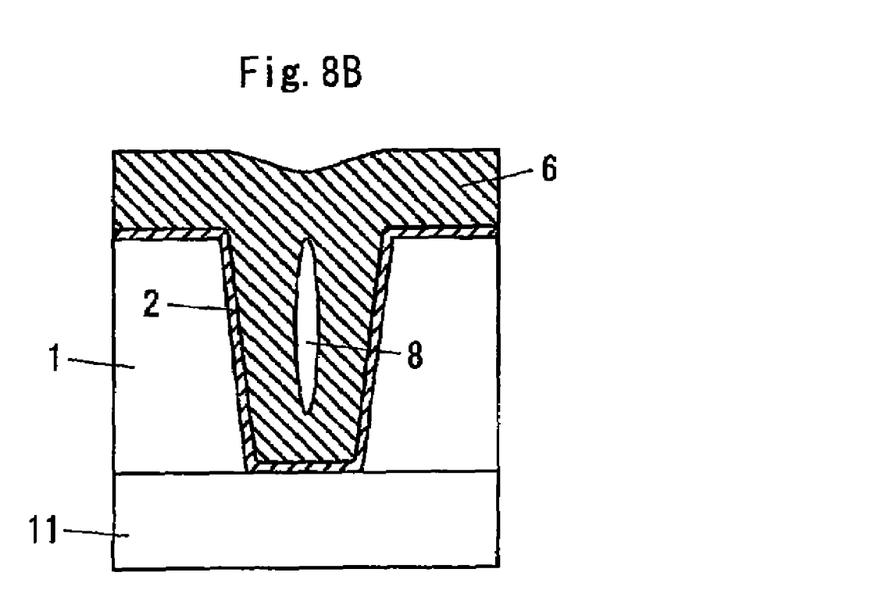

In consequence, the void 5 in the expansion flow layer 6 is compressed to contract as shown in FIG. 7D, and in a final stage of the heat treatment, the void 5 completely disappears as shown in FIG. 7E. Even in a case where the open pore 7 is generated, the expansion flow layer 6 is subjected to the heat treatment, thereby expanding and fluidizing the expansion flow layer. Accordingly, after the surface of the open pore 7 is flattened as shown in FIG. 8A, the pore shifts to a void 8 as shown in FIG. 8B. Moreover, thereafter the void is compressed to contract in the same manner as in FIG. 7D, and finally filled in completely in the same manner as in FIG. 7E, and the void 8 disappears.

As described above, according to the method for manufacturing semiconductor device in the second embodiment of the present invention, the oxidation preventive layer 2 is formed on the concave and convex portion 1 formed by the element on the semiconductor substrate 11, and on the layer, the expansion flow layer 6 is formed. Moreover, the semiconductor device on which these films have been formed is subjected to the heat treatment in the high-pressure oxidation atmosphere to expand and fluidize the expansion flow layer 6, whereby it is possible to obtain an effect that the void 5 (bubble) generated in the expansion flow layer 6 can completely be eliminated. Even in a case where the open pore 7 is generated because the concave and convex portion 1 is insufficiently filled with the expansion flow layer 6, the open pore 7 is filled in owing to the effects of expansion and fluidization, whereby it is possible to obtain an effect that the open pore 7 can be eliminated. As this result, yield of the device can be enhanced.

Moreover, in a case where the expansion flow layer 6 is expanded and fluidized, in the same manner as in the first embodiment, the temperature and time of the heat treatment depend on the expansion of the expansion flow layer 6. Therefore, as the void 5 becomes small, the expansion of the expansion layer for eliminating the void 5 may be reduced. In consequence, it is possible to similarly lower the treatment temperature or shorten the treatment time.

It is to be noted that the method for manufacturing semiconductor device of the present invention has been described in accordance with the preferable embodiments, but it would be understood that the scope contained in the present invention is not limited to the embodiments. Conversely, the scope of the present invention includes all improvements, modifications and equivalents included in the appended claims.

The invention claimed is:

1. A method for manufacturing a semiconductor device, comprising the steps of:
   forming a first film, an oxidation preventive layer that prevents permeation of moisture into the element, on a concave and convex portion formed by an element on a semiconductor substrate;
   forming a second film, an expansion layer that can be oxidized and expanded by a heat treatment in an oxidation atmosphere, on the oxidation preventive layer;
   forming a third film, an insulating film that can be fluidized by the heat treatment in the oxidation atmosphere, on the expansion layer; and
   exposing the semiconductor substrate, on which the oxidation preventive layer, the expansion layer and the insulating film have been formed, to the heat treatment in an oxidation atmosphere, in order to fluidize the insulating film and to oxidize and expand the expansion layer, thereby eliminating bubbles generated in the insulating film,
   wherein the expansion layer is made of a silicide,
   wherein the insulating film is a silicon oxide film containing at least one of phosphorus, arsenic, boron, fluorine and a halide, and
   wherein the oxidation preventive layer is formed of a silicon nitride film.

2. The method for manufacturing semiconductor device according to claim 1, wherein a pressure of the oxidation atmosphere in the expansion step is atmospheric pressure or more, and a temperature of the heat treatment is 400° C. to 800° C.

3. A method for manufacturing a semiconductor device, comprising the steps of:
   forming a first film, an oxidation preventive layer that prevents permeation of moisture into the element, on a concave and convex portion formed by an element on a semiconductor substrate;
   forming a second film, an expansion layer that can be oxidized and expanded by a heat treatment in an oxidation atmosphere, on the oxidation preventive layer;
   forming a third film, an insulating film that can be fluidized by the heat treatment in the oxidation atmosphere, on the expansion layer; and
   exposing the semiconductor substrate, on which the oxidation preventive layer, the expansion layer and the insulating film have been formed, to the heat treatment in an oxidation atmosphere, in order to fluidize the insulating film and to oxidize and expand the expansion layer, thereby eliminating bubbles generated in the insulating film,
   wherein the expansion layer is made of aluminum, tantalum or an alloy of aluminum or tantalum,
   wherein the insulating film is a silicon oxide film containing at least one of phosphorus, arsenic, boron, fluorine and a halide, and
   wherein the oxidation preventive layer is formed of a silicon nitride film.

\* \* \* \* \*